(12) United States Patent
Sung

(10) Patent No.: US 6,458,661 B1
(45) Date of Patent: Oct. 1, 2002

(54) METHOD OF FORMING NROM

(75) Inventor: Jiann-Long Sung, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/881,765

(22) Filed: Jun. 18, 2001

(51) Int. Cl.[7] .......................................... H01L 21/8234
(52) U.S. Cl. ...................... 438/275; 438/303; 438/595; 438/954; 257/390
(58) Field of Search .................................. 438/197, 216, 438/230, 261, 275, 276, 277, 278, 299, 303, 585, 591, 592, 595, 954; 257/390, 391, 392, 288, 324, 384, 410, 411

(56) References Cited

U.S. PATENT DOCUMENTS 6,399,466 B2 * 6/2002 Nakamura .................. 438/591

* cited by examiner

Primary Examiner—Chandra Chaudhari
Assistant Examiner—Jack Chen

(57) ABSTRACT

A method of forming a nitride read only memory (NROM) is disclosed. On the present invention's method of forming the NROM, firstly one or a plurality of isolated layers are formed to cover the oxide/nitride/oxide (ONO) structure and the gate, and the silicon nitride ($SiN_x$) spacer is formed to protect the NROM cell. If the silicon nitride spacer contacts with the gate directly, the threshold voltage of the NROM device will increase, therefore the present invention uses one or a plurality of the isolated layers composed of the silicon oxides ($SiO_y$) to isolate the NROM device and the silicon nitride spacer. It not only can protect the NROM device, but also can avoid side effects resulting from the use of the silicon nitride spacer and inducing the leakage current between the devices.

21 Claims, 2 Drawing Sheets

METHOD OF FORMING NROM

FIELD OF THE INVENTION

The present invention relates to a method of forming a nitride read only memory (NROM). The present invention relates more particularly to a method of forming an isolated spacer on the NROM.

BACKGROUND OF THE INVENTION

Referring to FIG. 1, it shows a cross-sectional view of the conventional NROM cell's structure. The NROM cell's forming process is described as follows: firstly, the active area is defined on the substrate 100 by using photolithography and, for example the wet etching method, and the phosphorous ions (P−) are doped into the substrate 100 by using the ion implantation to form the channel 104. Subsequently, the first oxide layer 108, the nitride layer 110, and the second oxide layer 112 are deposited (Oxidation) on the substrate 100 in turn, wherein the nitride layer 110 is located between the first oxide layer 108 and the second oxide layer 112. The first oxide layer 108, the nitride layer 110, and the second oxide layer 112 are defined by using photolithography and etching process to form an oxide/nitride/oxide (ONO) structure 114 and expose the substrate 100.

Next, the polysilicon layer 116 is deposited to cover the second oxide layer 112, and the silicide layer 118 is deposited to cover the polysilicon layer 116. Similarly, the polysilicon layer 116 and the silicide layer 118 are defined to form the gate 120 and expose the ONO structure 114 by using photolithography and etching process. Then, a material layer, such as the silicon dioxide ($SiO_2$), the tetra-ethyl-ortho-silicate (TEOS), or the silicon nitride ($Si_3N_4$) etc., is deposited by such as the chemical vapor deposition (CVD) to cover the substrate 100, the ONO structure 114, and the gate 120. The material layer is defined by using photolithography and the anisotropic etching method to form the spacer 122.

Subsequently, the high concentration and great depth heavy doping is performed on the substrate 100 by using the structure consisting of the spacer 122 and the gate 120 as the mask, and the phosphorous (P) or the arsenic (As) that has greater solid solubility to the silicon (Si) as the ion source, so that the drain 102 and the source 106 are completed. An insulated layer 124 is deposited to cover the substrate 100, the spacer 122, and the silicide layer 120, and then the inter-level dielectrics (ILD) layer 126 is deposited to cover the insulated layer 124. Developed to this present, the conventional NROM cell structure is completed.

However, about the following process, the NROM device usually endures ultra-violet light illumination or penetrating plasma used to excite the NROM device's atoms, so as to make the device's atoms become charging ions that increase the NROM device's chargers. They also affect the device's stability, and damage the device.

SUMMARY OF THE INVENTION

According to the conventional method of forming the NROM cell, the NROM cell cannot resist the ultra-violet light or penetrating plasma, so increases in the charges result in the device's electrical instability, and decrease the product yield.

Accordingly, one aspect of the invention is to provide a NROM forming method, on forming the NROM cell, the present invention's method forms the protective layer on the gate and the ONO structure, and the protective layer can resist the ultra-violet light illumination and the penetrating plasma to prevent the NROM device atoms from being excited and thus become charging ions, so that the device's electrical stability can be protected and maintained.

Another aspect of the invention is to provide a NROM forming method, and the NROM cell formed by using the present invention's method has a protective layer. The protective layer composed of one or a plurality of isolated material layers and a silicon nitride ($Si_3N_4$) spacer is located on the gate and ONO structure. Therefore, it is not only can prevent the ultra-violet light or penetrating plasma, but it also can avoid side effects, such as the increasing threshold voltage, induced by the direct contact of the silicon nitride ($Si_3N_4$) spacer and, for example, ONO device, and can also avoid the device's damage by leakage current.

For at least the foregoing aspects discussed above, the present invention provides a NROM forming method. The present invention's method firstly forms at least one isolated layer on the ONO structure and gate of the NROM cell, and forms a silicon nitride spacer, such as the silicon oxide ($SiO_y$), to constitute a protective structure, wherein the isolated layer is used to isolate the NROM cell and silicon nitride spacer. As the silicon nitride ($Si_3N_4$) contacts with the NROM device directly, the device's threshold voltage increases. Therefore, it can prevent the ultra-violet light or plasma damage and avoid increase in the device's threshold voltage simultaneously, and can avoid leakage current induced between the devices that damage the devices by applying the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Generally, to delete the data stored in the erasable programmable read only memory (EPROM), it is to put the whole EPROM under the ultra-violet light for about ten minutes to make the electrons trapping in the EPROM's floating gate absorb the ultra-violet light's energy, so as to escape from the floating gate, and so the data can be erased. However, the NROM is different from the EPROM. The data stored in the NROM cannot be erased by using the ultra-violet light, and the NROM device's atoms illuminated by the ultra-violet light are excited to become the charging ions, so as to result in increasing the NROM device's charges, affecting the device's electrical stability, and damaging the device. Therefore, the NROM needs a structure to isolate the device from ultra-violet light.

On the forming process of the NROM, it cannot avoid the plasma ions in use that penetrating into the NROM cell, and the plasma ions react with the NROM device's atoms to change the atoms into the charging ions, so as to result in increasing the device's charges and decrease the NROM device's electrical stability. According to the aforementioned, the NROM cell needs a protective structure to resist the ultra-violet light and plasma.

Figure 1:
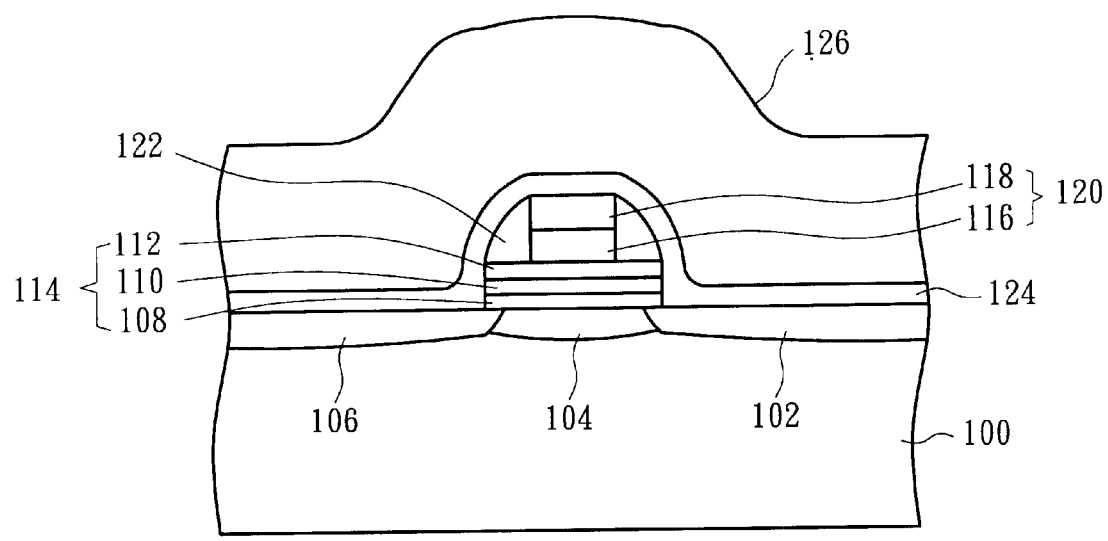
FIG. 1 is a cross-sectional view of the structure of the conventional NROM cell.
Figure 2:
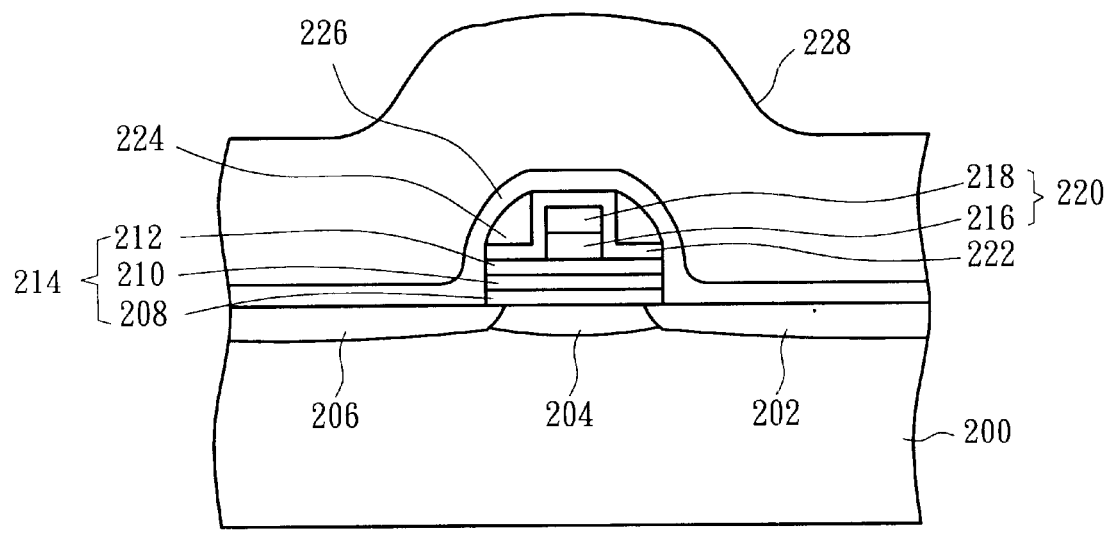
FIG. 2 is a cross-sectional view of the structure of the NROM cell in accordance with the present invention's preferred embodiment.

Referring to FIG. 2, it shows a cross-sectional view of the structure of the NROM cell in accordance with the present invention's preferred embodiment. Firstly, the active area is defined on the substrate 200 by using photolithography and, for example the wet etching method. The phosphorous ions (P–) are doped into the substrate 200 by using the ion implantation to form the channel 204. Subsequently, the first oxide layer 208 is deposited to cover the substrate 200, the nitride layer 210 is deposited to cover the first oxide layer 208, and the second oxide layer 212 is deposited to cover the substrate 200. The first oxide layer 208, the nitride layer 210, and the second oxide layer 212 are defined by using photolithography and the etching method to form an oxide/nitride/oxide (ONO) structure 214 and expose the substrate 200.

Next, the polysilicon layer 216 is deposited to cover the ONO structure 214, and the silicide layer 218 is deposited to cover the polysilicon layer 216, wherein depositing the polysilicon layer 216 and silicide layer 218 is performed by using low pressure chemical vapor deposition (LPCVD), and the material of the silicide layer 218, for example, can be tungsten silicide ($WSi_2$) or titanium silicide ($TiSi_2$). The polysilicon layer 216 and the silicide layer 218 are defined to form the gate 220 and expose the ONO structure 214 by using photolithography and the dry etching process.

An isolated layer 222 is deposited conformal on the gate 220 and ONO structure 214, wherein a material of the isolated layer 222 is silicon oxide ($SiO_y$). Then, a silicon nitride ($Si_3N_4$) layer is deposited to cover the substrate 200 and isolated layer 222, for example by plasma enhanced chemical vapor deposition (PECVD), and the silicon nitride layer is defined by using the photolithography and anisotropic etching method, so as to form a spacer 224 composed of the silicon nitride on the sidewall of the isolated layer 222.

One character of the present invention is taking the combination of the isolated layer 222 composed of the silicon oxide ($SiO_y$) and the spacer 224 composed of the silicon nitride ($Si_3N_4$) as the NROM device's protective structure. The protective structure's spacer 224 composed of the silicon nitride ($Si_3N_4$) is used to prevent the Ultra-violet light and penetrating plasma, and the isolated layer 222 composed of the silicon oxide ($SiO_y$) is used to isolate the silicon nitride contacting with the NROM device directly, so as to avoid increasing the NROM device's threshold voltage and prevent inducing the leakage current between the devices.

Subsequently, the high concentration and great depth heavy doping is performed on the substrate 200 by using the phosphorous (P) or the arsenic (As) that has greater solid solubility to the silicon (Si) as the ion source, and the structure consisting of the spacer 224 and the isolated layer 222 as the mask, so as to form the drain 202 and the source 206. An insulated layer 226 is deposited to cover the substrate 200, the spacer 224, and the isolated layer 222, and then the inter-level dielectrics layer 228 is deposited.

Figure 3:
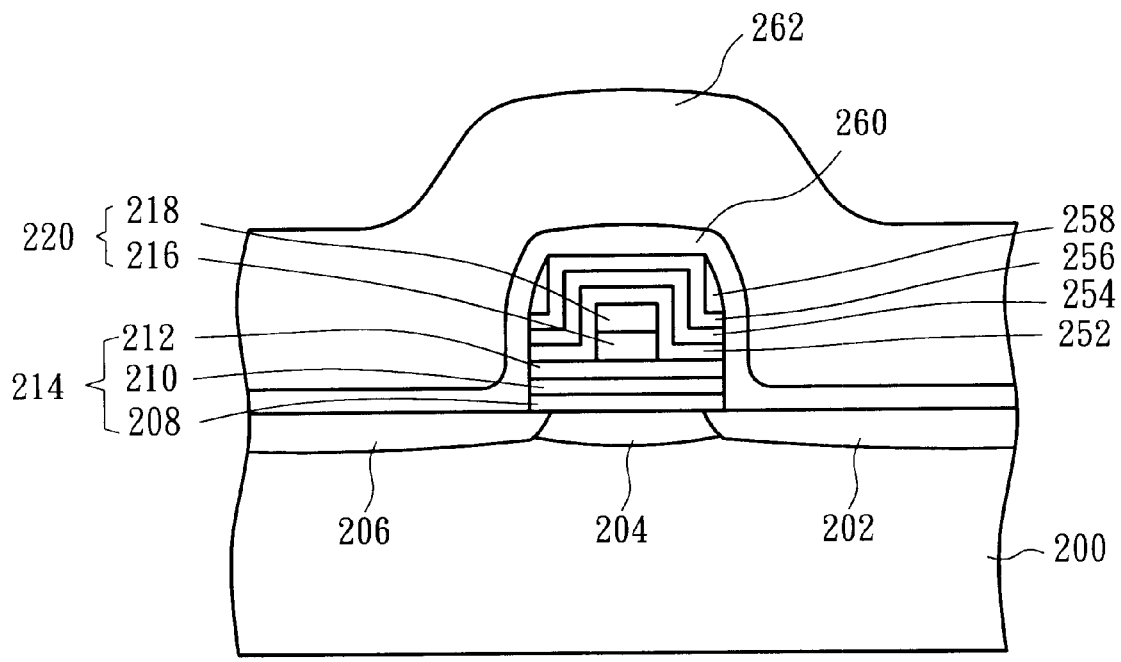
FIG. 3 is a cross-sectional view of the structure of the NROM cell in accordance with the present invention's other preferred embodiment.

Referring to FIG. 3, it shows a cross-sectional view of the structure of the NROM cell in accordance with the present invention's other preferred embodiment. To forming the structure of the NROM cell is to deposit conformably the first isolated layer 252, the second isolated layer 254, and the third isolated layer 256 in turn on the ONO structure 214 and gate 220 of the NROM cell structure in FIG. 2, wherein materials of the first isolated layer 252, the second isolated layer 254, and the third isolated layer 256 are silicon oxides ($SiO_y$), but the compositions of three isolated layers are different.

Next, a silicon nitride ($Si_3N_4$) layer is deposited to cover the substrate 200 and third isolated layer 256, for example by plasma enhanced chemical vapor deposition (PECVD), and the silicon nitride layer is defined by using the photolithography and anisotropic etching method, so as to form a spacer 258 composed of the silicon nitride on the sidewall of the third isolated layer 256. An insulated layer is deposited to cover the substrate 200, the spacer 258, and the third isolated layer 256, and then the inter-level dielectrics layer 262 is deposited.

In the above-mentioned NROM structure, there are three isolated layers, i.e. the first isolated layer 252, the second isolated layer 254, and the third isolated layer 256, formed on the ONO structure 214 and gate 220, although the materials of the three isolated layers are silicon oxide ($SiO_y$), but the recipes of any two adjacent layers of the three isolated layers are different. Therefore, there are more isolated layers in the NROM structure, and it can not only avoid the side effects, such as the increasing threshold voltage, resulting from the direct contact of the silicon nitride ($Si_3N_4$) and the NROM device, but also can avoid the leakage current induced between the devices to damage the devices.

The present invention's advantage is to provide a method of forming the NROM having the protective function. The present invention's method uses the silicon nitride ($Si_3N_4$) spacer and at least one silicon oxide ($SiO_y$) layer to protect the NROM device. Wherein, the isolated layer located between the NROM device and spacer to isolate the NROM device and spacer. Therefore, it is not only can protect the NROM device from the ultra-violet light and penetrating plasma ions to damage the device's electrical stability, but also can avoid the threshold voltage resulting from the contact of the NROM device and silicon nitride ($Si_3N_4$), and prevent the leakage current induced between the devices.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a nitride read only memory (NROM), comprising:
    providing a substrate, wherein the substrate has an oxide/nitride/oxide (ONO) structure formed thereon;
    forming a gate to cover portion of the oxide/nitride/oxide structure;
    forming an isolated layer to cover the gate and the other portion of the oxide/nitride/oxide structure;
    forming a spacer, wherein the spacer is located on the sidewall of the isolated layer; and
    forming an insulated layer to cover the substrate, the spacer, and the isolated layer.

2. The method according to claim 1, wherein the gate includes a polysilicon layer and a silicide layer.

3. The method according to claim 1, wherein the step of forming the isolated layer is performed by a conformal deposition.

4. The method according to claim 1, wherein a material of the isolated layer is silicon oxide ($SiO_y$).

5. The method according to claim 1, wherein the isolated layer and the spacer constitute a protective structure.

6. The method according to claim 1, wherein a material of the spacer is silicon nitride ($Si_3N_4$).

7. A nitride read only memory (NROM) structure, comprising:

a substrate, wherein the substrate has an oxide/nitride/oxide (ONO) structure formed thereon;

a gate located on portion of the oxide/nitride/oxide structure;

an isolated layer located on the gate and the other portion of the oxide/nitride/oxide structure;

a spacer located on the sidewall of the isolated layer; and an insulated layer located on the substrate, the spacer, and the isolated layer.

8. The nitride read only memory according to claim 7, wherein the isolated layer is performed by a conformal deposition.

9. The nitride read only memory according to claim 7, wherein a material of the isolated layer is silicon oxide ($SiO_y$).

10. The nitride read only memory according to claim 7, wherein the isolated layer and the spacer constitute a protective structure.

11. The nitride read only memory according to claim 7, wherein a material of the spacer is silicon nitride ($Si_3N_4$).

12. A method of forming a nitride read only memory (NROM), comprising:

providing a substrate, wherein the substrate has an oxide/nitride/oxide (ONO) structure formed thereon;

forming a gate to cover portion of the oxide/nitride/oxide structure;

forming a plurality of isolated layers to cover the gate and the other portion of the oxide/nitride/oxide structure;

forming a spacer, wherein the spacer is located on the sidewall of the isolated layers; and forming an insulated layer to cover the substrate, the spacer, and the isolated layers.

13. The method according to claim 12, wherein the step of forming the isolated layers is performed by a conformal deposition.

14. The method according to claim 12, wherein materials of the isolated layers are selected from silicon oxides ($SiO_y$), and the materials of any two adjacent layers of the isolated layers are different.

15. The method according to claim 12, wherein the isolated layers and the spacer constitute a protective structure.

16. The method according to claim 12, wherein a material of the spacer is silicon nitride ($Si_3N_4$).

17. A nitride read only memory (NROM) structure, comprising:

a substrate, wherein the substrate has an oxide/nitride/oxide (ONO) structure formed thereon;

a gate located on portion of the oxide/nitride/oxide structure;

a plurality of isolated layers located on the gate and the other portion of the oxide/nitride/oxide structure;

a spacer located on the sidewall of the isolated layers; and an insulated layer located on the substrate, the spacer, and the isolated layers.

18. The nitride read only memory according to claim 17, wherein the isolated layers is performed by a conformal deposition.

19. The nitride read only memory according to claim 17, wherein materials of the isolated layers are selected from silicon oxides ($SiO_y$), and the materials of any two adjacent layers of the isolated layers are different.

20. The nitride read only memory according to claim 17, wherein the isolated layers and the spacer constitute a protective structure.

21. The nitride read only memory according to claim 17, wherein a material of the spacer is silicon nitride ($Si_3N_4$).

* * * * *